United States Patent [19]
Ballman et al.

[11] 4,073,675
[45] Feb. 14, 1978

[54] WAVEGUIDING EPITAXIAL LINBO₃ FILMS

[75] Inventors: Albert Anthony Ballman, Woodbridge; Harold Brown, Middletown; Raymond John Martin, Middlesex Borough; Ping King Tien, Chatham Township, Morris County, all of N.J.

[73] Assignee: Bell Telephone Laboratories, Incorporated, Murray Hill, N.J.

[21] Appl. No.: 707,309

[22] Filed: July 21, 1976

[51] Int. Cl.² .............. B01J 17/24; C01G 35/00; C01G 1/00
[52] U.S. Cl. ............ 156/600; 156/DIG. 87; 156/619; 423/593; 427/162
[58] Field of Search ............ 156/DIG. 87, 600, 619; 423/593; 427/162, 163

[56] References Cited
PUBLICATIONS

Miyazawa, Appl. Phys. Lett., vol. 23, No. 4, Aug. 15, 1973, pp. 198–200.
Tien, Appl. Phy. Lett., vol. 24, No. 10, May 15, 1974, pp. 503–506.
Ballman, Journal of Crystal Growth, vol. 30, No. 1, Aug. 1975, pp. 37–41.
Ballman, Journal of Crystal Growth, 29, 1975, pp. 289–295.
Tien, J. of Vacuum Science and Tech., vol. 12, No. 4, July–Aug. 1975, pp. 892-904.

*Primary Examiner*—Stephen J. Emery
*Attorney, Agent, or Firm*—Walter G. Nilsen

[57] ABSTRACT

A process is described for making optical circuits on LiTaO₃ substrates. The process involves putting down an epitaxial layer of LiNbO₃ on the LiTaO₃ substrates. Growth is preferably carried out on certain planes of the LiTaO₃. These optical circuits are unique in that they are smooth, uniform in thickness and have a refractive index significantly larger than that of the substrate. This is advantageous in optical circuitry, since the optical modes in the circuits are quite distinct and can be coupled separately using such light sources as lasers and light emitting diodes.

8 Claims, 3 Drawing Figures

WAVEGUIDING EPITAXIAL LINBO₃ FILMS

BACKGROUND OF THE INVENTION

Extensive work is being carried out in the development of materials suitable for optical waveguiding devices. Principal problems in the fabrication of optical waveguiding devices are the need for high optical quality including freedom from defects and smooth change from substrate to optical film. It is also desirable for many applications to have a sharp and large change in refractive index from substrate to optical film. This produces widely separated modes which are easy to couple into and out of integrated optical circuits.

Particularly attractive, principally because of high index of refraction, is thin films of $LiNbO_3$. Growth techniques reported in the literature include diffusion, vapor deposition and liquid phase epitaxial processes. The compound $LiTaO_3$ is commonly used as the substrate because it is isostructural with $LiNbO_3$ which permits epitaxial growth of thin films. None of the earlier methods are, however, completely satisfactory. For example, diffusion process produces a layer with relatively small refractive index difference between film and substrate (usually less than 1%), although it does have the advantage of leaving the substrate surface in its original highly polished state, which greatly facilitates device fabrication. Liquid phase epitaxial growth through flux is a useful process, but the flux usually introduces additional loss to the circuit and thus undesirable for some applications.

The melt phase process produces a large refractive index change between substrate and film but the nature of the high temperature melt phase reaction sometimes introduces optical imperfections. For example, Miyazawa (Appl. Phys. Lett. 23, 198 (1973)) describes melt phase epitaxial growth of $LiNbO_3$ on $LiTaO_3$ substrates. The films were grown on the C and A planes. It is highly desirable to have a process for making optical waveguiding circuits which yield both high index changes and leave the substrate surface in its original polished condition.

SUMMARY OF THE INVENTION

The invention is a process for making optical circuits on $LiTaO_3$ substrates in which an epitaxial layer of $LiNbO_3$ is grown on the $LiTaO_3$ substrates. Only certain specific crystallographic planes of $LiTaO_3$ are used for growth of $LiNbO_3$. These crystallographic planes which are crystallographically equivalent in the $LiTaO_3$ structure are the $\bar{1}0.2$, $1\bar{1}.2$, and $01.2$ planes. Certain other crystallographic planes which are nearly equivalent to these planes may also be used. They are the $10.\bar{2}$, $0\bar{1}.\bar{2}$ and $\bar{1}1.\bar{2}$ planes. Growth is carried out by first putting powdered $LiNbO_3$ on the $LiTaO_3$ substrate and heating to above the melting temperature of $LiNbO_3$ and slow cooling. The $LiNbO_3$ powder may be applied to the substrate in two ways: First, $LiNbO_3$ powder is suspended in an organic vehicle and then painted or sprayed on the substrate. It is preferred that the organic vehicle have a reasonable viscosity, generally above 800 centipoise at room temperature (20° C). The substrate with painted suspension is slowly heated to a temperature between the melting temperature of $LiNbO_3$ and $LiTaO_3$ and then cooled at between 10° and 50° C per hour to below the melting point of $LiNbO_3$. Film thickness can be controlled by varying the thickness of the applied liquid suspension. In another procedure, film thickness is controlled by application of pressure between the molten $LiNbO_3$ and the $LiTaO_3$ substrate. A thin sheet of platinum is used for this purpose and is peeled away after the growth process is completed. Films grown in accordance with the above procedures have high optical quality and rapid index change from substrate to grown film. Experiments show that they form excellent optical waveguides and are particularly useful for forming electrooptical devices such as light beam scanners, polarization switches, etc.

DETAILED DESCRIPTION

Figure 1:
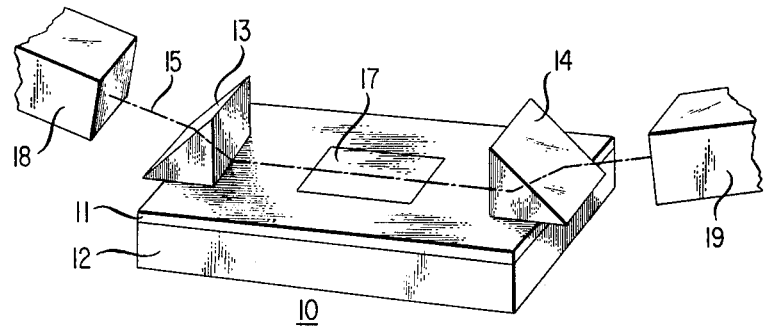
FIG. 1 shows in diagrammatic form an optical device utilizing the epitaxial layer of $LiNbO_3$ on $LiTaO_3$.

The invention is a process for making optical circuits on $LiTaO_3$ substrates in which an epitaxial layer of $LiNbO_3$ is grown on the substrate. The $LiTaO_3$ substrate is oriented crystallographically so growth takes place on a specific crystallographic plane. This crystallographic plane is the $\bar{1}0.2$ plane or equivalent plane ($1\bar{1}.2$ and $10.2$). Equally good results are obtainable from closely related planes, namely the $10.\bar{2}$, $0\bar{1}.\bar{2}$ and $\bar{1}1.\bar{2}$ crystallographic planes. It has been found that $LiNbO_3$ films grown on these crystallographic planes are unusually uniform and smooth which makes them particularly suitable for optical applications. It also permits use of these films in optical applications with little or no polishing which substantially simplifies and reduces the cost of commercial production.

The particular procedure for growing the $LiNbO_3$ epitaxial layer is also of importance. A melt phase procedure is used. This procedure produces a substantial refractive index change from substrate to film which permits greater resolution of individual optical waveguide modes. First, a powder of the $LiNbO_3$ is put down on the $LiTaO_3$ substrate. Particle size of the $LiNbO_3$ powder has a profound effect on the results of the epitaxial growth process. Small size, preferably less than 50 microns is highly desirable. Such a powder may be made by grinding a sifting through a mesh (generally a 300 mesh). Uniform particle size is also desirable and this may be accomplished by sifting through another mesh (say 400) to remove smaller particles. This yields a powder with particle size approximately in the range from 25–50 microns. Smaller sizes are desirable but more difficult to produce.

The substrate surface may be polished for best results although such polishing is often not necessary. To insure good control of the film thickness throughout the epitaxial layer, the $LiNbO_3$ powder may be suspended in a type of substance which should evaporate or decompose on heating. This suspension can then be sprayed or painted onto the $LiTaO_3$ substrate. Reasonably high viscosity is preferred, say 800 or even 2000 centipoise at 20° C to insure that the powder remains approximately uniformly distributed in the organic vehicle. Typically, a lacquer suspension is used. After applying the suspension to the substrate the sample is subsequently heated to a temperature above the melting temperature of LiNbO$_3$ but below the melting temperature of LiTaO$_3$. On heating, the organic vehicle evaporates or decomposes leaving a uniform distribution of LiNbO$_3$ powder on the substrate. On reaching the melting point of the LiNbO$_3$ the powder melts. The substrate with molten LiNbO$_3$ is maintained at a temperature between the melting temperature of LiNbO$_3$ and LiTaO$_3$ (1260°-1320° C) for some time (typically 1 minute to 2 hours, depending on desired amount of solid solution). On subsequent cooling, the epitaxial crystalline layer forms. This procedure of lacquer suspension application and heat cycling may be repeated to adjust the thickness of the epitaxial layer.

Film thickness may be controlled in another way which does not involve use of a suspension of LiNbO$_3$ powder. In this procedure LiNbO$_3$ powder is put down on the LiTaO$_3$ substrate and a thin sheet of inert material such as platinum is put down on top of the LiNbO$_3$ powder. The film thickness is controlled by the application of various pressures or weights on the platinum sheet. Typical weights are 1-20 gms over a cm$^2$ area. Most useful thicknesses are obtained with a 5-15 gm/cm$^2$ pressure. The growth process is carried out as above by heating the substrate with powder to a temperature between the melting point of LiNbO$_3$ and LiTaO$_3$. The platinum sheet may be peeled away after completion of the growth process. Generally, film thicknesses are typically from 1 to 20 micrometers.

Because the crystal structure of the LiTaO$_3$ substrate and LiNbO$_3$ film are closely related, the two materials form good epitaxial layers. Also, it is believed that some solid solution occurs between the two materials which causes the lattice parameter to be graded at the interface. Such condition leads to excellent epitaxial layers with a minimum of strain between layer and substrate.

In the preparation of the LiNbO$_3$ powder certain dopants may be added to obtain desired optical properties. A particular example is the use of rare earth ions, such as neodynium to produce laser action. Also, slight variations in the heat cycling procedure can be used to alter the composition profile of the LiNbO$_3$ film. For example, it is believed that the films formed on the substrate are actually solid solutions of LiNbO$_3$ and LiTaO$_3$ in which the concentration of LiTaO$_3$ decreases with distance away from the substrate. This composition profile is a function of growth temperature and may be varied by varying the conditions of growth.

A typical procedure is as follows: LiNbO$_3$ powder having an average particle size of approximately 25 to 50 micron units is suspended in a commercial lacquer and then painted or sprayed onto a prepolished LiTaO$_3$ substrate. Particularly good results in terms of smooth films of uniform thickness is obtained if the LiNbO$_3$ powder has small particle size and uniform particle size. It is preferred that 80 percent of the LiNbO$_3$ powder has particle size between 25 and 50 microns. The substrate with painted suspension is slowly heated to a temperature between 1260° and 1320° C. During the early stages of heating the organic vehicle decomposes or volatilizes usually at about 600° C. This leaves a uniform layer of LiNbO$_3$ powder on the substrate. At about 1260° C the powder melts. The substrate is usually maintained in the temperature range from 1260° C to 1320° C for some period of time. The substrate is then slowly cooled at about 10° to 50° per hour yielding a LiNbO$_3$ single crystal layer epitaxially joined to the substrate of LiTaO$_3$. A cooling rate of 15° to 30° C is preferred because it yields epitaxial layers of high optical quality. Generally, the slow cooling need only extend to about 600° C.

The Figures show various devices which can be made using the inventive process. FIG. 1 shows an integrated circuit 10 which is useful in processing laser radiation. This epitaxial device is made up of a substrate of single crystal lithium tantalate 12 with a layer of epitaxial lithium niobate 11. Laser radiation 15 originates from a laser 18 and is coupled into the epitaxial layer 11 by means of a prism 13. The laser radiation inside the epitaxial layer passes through an epitaxially active region 17 which processes the laser radiation. The processed laser radiation 15 is coupled out of the epitaxial layer by means of a prism 14 and then into the utilization apparatus 19.

Figure 2:
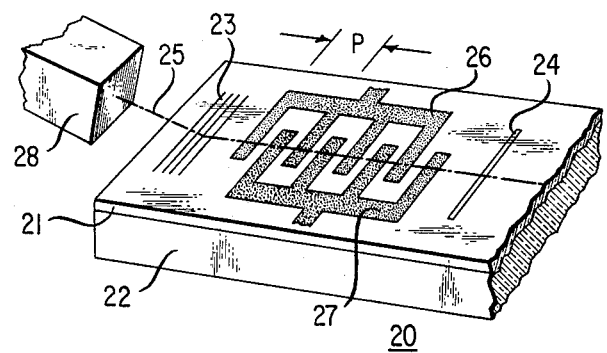
FIG. 2 shows in diagrammatic form an electrooptic device utilizing an epitaxial layer of $LiNbO_3$ on a $LiTaO_3$ substrate.

FIG. 2 illustrates a different type of epitaxial device 20. Again the main part of the epitaxial device consists of a lithium tantalate substrate 22 with an epitaxial layer of lithium niobate 21. Laser radiation 25 which originates from a laser 28 is coupled into the epitaxial layer by means of a grating coupler 23. Electrodes 26 and 27, generally made of conducting electrode material such as copper, are used to alter the electrooptic properties of the layer. Particularly illustrative is the use of these electrodes to couple TF polarization modes into TM. A polarizer 24 may be used to remove one of the modes.

Figure 3:
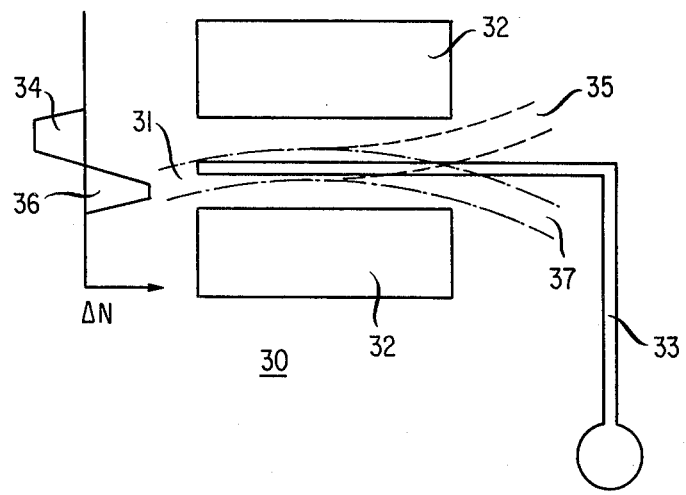
FIG. 3 shows in diagrammatic form a light scanning device utilizing an epitaxial layer of $LiNbO_3$ on a $LiTaO_3$ substrate.

FIG. 3 shows a light beam scanning and reflection device 30 with light beam 31 and electrodes 32. The device is also equipped with a ground plane 33. On inducing a negative index change as shown at 34, the light beam is bent in one direction as shown at 35. On electrically inducing a positive index change 36, the light beam is bent in the opposite direction as at 37.

What is claimed is:

1. A process for producing epitaxial crystalline films of LiNbO$_3$ on LiTaO$_3$ substrates in which the films are grown on a crystallographic plane of LiTaO$_3$ selected from the group consisting of the $\overline{1}0.2$, $\overline{1}\overline{1}.2$, 01.2, 10.$\overline{2}$, 0$\overline{1}$.$\overline{2}$ and $\overline{1}1$.$\overline{2}$ planes comprising the steps of:
   a. preparing the LiNbO$_3$ in the form of a powder with particle size less than 50 microns,
   b. preparing a suspension of LiNbO$_3$ in a viscous liquid organic medium which evaporates or decomposes on heating,
   c. spreading some of the suspension of LiNbO$_3$ on the LiTaO$_3$ substrate,
   d. heating the LiTaO$_3$ substrate to a temperature between 1260° and 1320° C,
   e. maintaining the temperature of the LiTaO$_3$ substrate between 1260° and 1320° C for from 1 minute to 2 hours,
   f. cooling the LiTaO$_3$ substrate at a rate of 10°-50° C per hour to below 600° C.

2. The process of claim 1 in which the viscous liquid organic medium has a viscosity of at last 800.

3. The process of claim 2 in which viscous organic medium is a lacquer.

4. The process of claim 1 in which the particle size is between 25 and 50 microns.

5. The process of claim 1 in which the cooling is between 15° and 30° C per hour.

6. A process for producing epitaxial crystalline films of LiNbO$_3$ on LiTaO$_3$ substrates in which the films are grown on a crystallographic plane of LiTaO$_3$ selected from the group consisting of the $\overline{1}0.2$, $\overline{1}\overline{1}.2$, 01.2, 10.$\overline{2}$, 0$\overline{1}$.$\overline{2}$ and $\overline{1}1$.$\overline{2}$ planes comprising the steps of:
   a. preparing the LiNbO$_3$ in the form of a powder with particle size less than 50 microns, b. distributing some $LiNbO_3$ powder on the surface of the $LiTaO_3$ substrate, c. placing a platinum foil on top of the $LiNbO_3$ powder on the $LiTaO_3$ substrate, d. applying a pressure of 1–20 gms/cm² to the platinum sheet, e. maintaining the temperature of the $LiTaO_3$ substrate between 1260° and 1320° C for from 1 minute to 2 hours, f. cooling the $LiTaO_3$ substrate at a rate of 10°–50° C per hour to below 600° C and then to room temperature, removing the platinum foil.

7. The process of claim 1 in which the particle size is between 25 and 50 microns.

8. The process of claim 1 in which the cooling is between 15° and 30° C per hour.

* * * * *